US012237151B2

(12) United States Patent
Lee et al.

(10) Patent No.: US 12,237,151 B2
(45) Date of Patent: Feb. 25, 2025

(54) APPARATUS AND METHOD FOR PROCESSING SUBSTRATE USING PLASMA

(71) Applicant: SEMES CO., LTD., Chungcheongnam-do (KR)

(72) Inventors: Seong Gil Lee, Gyeonggi-do (KR); Young Je Um, Busan (KR); Myoung Sub Noh, Gyeonggi-do (KR); Dong Sub Oh, Busan (KR); Min Sung Han, Gyeonggi-do (KR); Dong Hun Kim, Seoul (KR); Wan Jae Park, Gyeonggi-do (KR)

(73) Assignee: SEMES CO, LTD., Chungcheongnam-do (KR)

( * ) Notice: Subject to any disclaimer, the term of this patent is extended or adjusted under 35 U.S.C. 154(b) by 141 days.

(21) Appl. No.: 17/885,543

(22) Filed: Aug. 11, 2022

(65) Prior Publication Data

US 2023/0197412 A1 Jun. 22, 2023

(30) Foreign Application Priority Data

Dec. 17, 2021 (KR) ........................ 10-2021-0182227

(51) Int. Cl.
*H01J 37/32* (2006.01)
*B08B 7/00* (2006.01)
(Continued)

(52) U.S. Cl.
CPC ...... *H01J 37/32422* (2013.01); *B08B 7/0035* (2013.01); *H01J 37/32449* (2013.01);
(Continued)

(58) Field of Classification Search
CPC ............ H01J 37/32422; H01J 37/3244; H01J 37/32449; H01J 2237/335;
(Continued)

(56) References Cited

U.S. PATENT DOCUMENTS 9,349,605 B1  5/2016 Xu et al.
10,424,463 B2  9/2019 Xu et al.
(Continued)

FOREIGN PATENT DOCUMENTS

KR  10-2017-0017827  2/2017
KR  10-2018-0094109  8/2018
(Continued)

OTHER PUBLICATIONS

Notice of Allowance dated Dec. 5, 2023 for Korean Patent Application No. 10-2021-0182227 and its English translation from Global Dossier.

*Primary Examiner* — Yuechuan Yu
(74) *Attorney, Agent, or Firm* — WOMBLE BOND DICKINSON (US) LLP

(57) ABSTRACT

A substrate processing apparatus using plasma capable of efficiently controlling the selectivity ratio of a silicon layer and an oxide layer is provided. The substrate processing apparatus comprises a first space disposed between an electrode and an ion blocker; a second space disposed between the ion blocker and a shower head; a processing space under the shower head for processing a substrate; a first supply hole for providing a first gas for generating plasma to the first space; a second supply hole for providing a second gas to be mixed with an effluent of the plasma to the second space; and a first coating layer formed on a first surface of the shower head facing the second space, not formed on a second surface of the shower head facing the processing space, and containing nickel.

13 Claims, 10 Drawing Sheets

(51) Int. Cl.
  *H01L 21/02* (2006.01)
  *H01L 21/3065* (2006.01)
(52) U.S. Cl.
  CPC . *H01J 2237/3346* (2013.01); *H01J 2237/335* (2013.01); *H01L 21/02057* (2013.01); *H01L 21/3065* (2013.01)
(58) Field of Classification Search
  CPC .......... H01J 2237/3346; B08B 7/0035; H01L 21/31116; H01L 21/32137; H01L 21/3065; H01L 21/02057
  See application file for complete search history.

(56) References Cited

U.S. PATENT DOCUMENTS

| | | | |
|---|---|---|---|
| 10,424,464 | B2 | 9/2019 | Xu et al. |
| 11,289,308 | B2 | 3/2022 | An et al. |
| 2019/0043726 | A1 | 2/2019 | Yang et al. |
| 2021/0098232 | A1* | 4/2021 | An ...................... H01L 21/3065 |
| 2023/0071985 | A1* | 3/2023 | Lee ................... H01L 21/02532 |

FOREIGN PATENT DOCUMENTS

| | | |
|---|---|---|
| KR | 10-2019-0117247 | 10/2019 |
| KR | 10-2020-0028041 | 3/2020 |
| KR | 10-2021-0037318 | 4/2021 |

\* cited by examiner

APPARATUS AND METHOD FOR PROCESSING SUBSTRATE USING PLASMA

This application claims the benefit of Korean Patent Application No. 10-2021-0182227, filed on Dec. 17, 2021, in the Korean Intellectual Property Office, the disclosure of which is incorporated herein by reference in its entirety.

BACKGROUND

1. Field

The present invention relates to a substrate processing apparatus and method using plasma.

2. Description of the Related Art

When manufacturing a semiconductor device or a display device, a substrate processing process using plasma may be used. A substrate processing process using plasma includes a CCP (Capacitively Coupled Plasma) method, an ICP (Inductively Coupled Plasma) method, and a method in which the two are mixed according to a method of generating plasma. In addition, dry cleaning or dry etching may be performed using plasma.

SUMMARY

Dry cleaning is isotropic etching, and there is less pattern collapse and less damage by plasma. However, when the silicon layer and the oxide layer are exposed on the substrate to be dry cleaned, it is necessary to control the selectivity ratio between the silicon layer and the oxide layer. That is, when the oxide layer is etched, the selectivity ratio of the oxide layer to the silicon layer should be high, and when the oxide layer and the silicon layer are etched as a whole, the selectivity ratio of the oxide layer to the silicon layer should not be high.

An object of the present invention is to provide a substrate processing apparatus using plasma, which can efficiently control a selectivity ratio between a silicon layer and an oxide layer.

Another object of the present invention is to provide a substrate processing method using plasma, which can efficiently control the selectivity ratio between the silicon layer and the oxide layer.

The objects of the present invention are not limited to the objects mentioned above, and other objects not mentioned will be clearly understood by those skilled in the art from the following description.

One aspect of the substrate processing apparatus according to the present invention for achieving the above technical object comprises a first space disposed between an electrode and an ion blocker; a second space disposed between the ion blocker and a shower head; a processing space under the shower head for processing a substrate; a first supply hole for providing a first gas for generating plasma to the first space; a second supply hole for providing a second gas to be mixed with an effluent of the plasma to the second space; and a first coating layer formed on a first surface of the shower head facing the second space, not formed on a second surface of the shower head facing the processing space, and containing nickel.

Another aspect of the substrate processing apparatus according to the present invention for achieving the above technical object comprises a first space disposed between an electrode and an ion blocker; a second space disposed between the ion blocker and a shower head; a processing space under the shower head for processing a substrate, on which a silicon layer and an oxide layer are exposed; a support module installed in the processing space and for supporting the substrate; a first supply hole for providing nitrogen trifluoride for generating plasma to the first space; a second supply hole for providing ammonia gas to be mixed with an effluent of the plasma to the second space; and a coating layer formed on at least one of an upper surface of the shower head and a lower surface of the ion blocker, and not formed on a lower surface of the shower head and a surface of the support module, wherein the coating layer includes a nickel-aluminum alloy layer or a nickel-phosphorus alloy layer, and an etching amount of the silicon layer varies according to a ratio of aluminum or phosphorus to nickel.

One aspect of the substrate processing method according to the present invention for achieving the above technical object comprises providing a substrate processing apparatus comprising a first space disposed between an electrode and an ion blocker, a second space disposed between the ion blocker and a shower head, a processing space under the shower head for processing a substrate, and a first coating layer formed on a first surface of the shower head facing the second space, not formed on a second surface of the shower head facing the processing space, and containing nickel, providing nitrogen and hydrogen-containing gas to the second space, providing fluorine-containing gas to the first space to form plasma in the first space, providing fluorine radical in an effluent of the plasma to the second space passing through the ion blocker, reacting the fluorine radical provided to the second space with the nitrogen and hydrogen-containing gas to form an etchant, wherein at least a portion of fluorine free radical generated when the etchant is formed is removed by the first coating layer.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
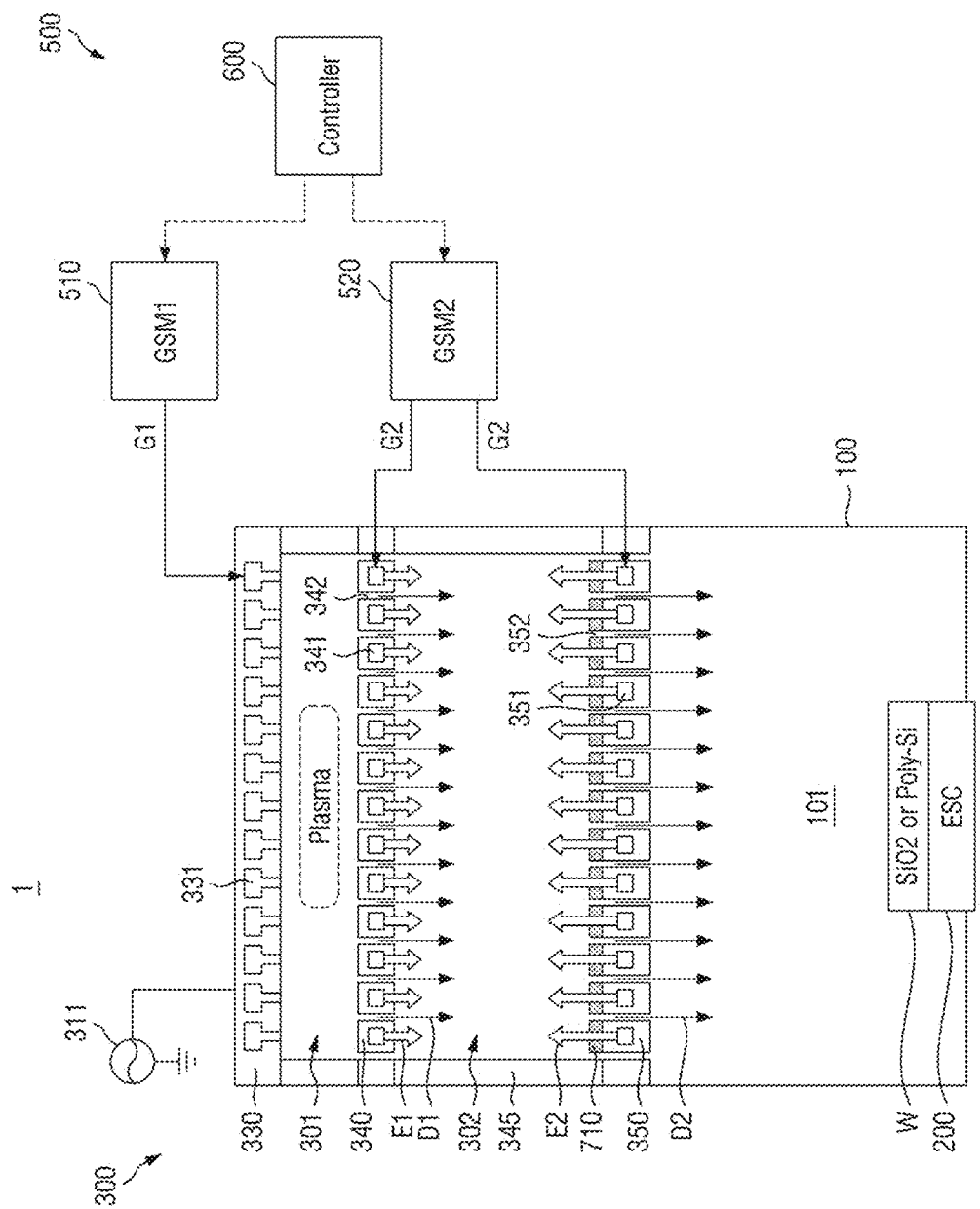
FIG. 1 is a conceptual diagram for describing a substrate processing apparatus according to a first embodiment of the present invention.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

When an element or layer is referred as being located "on" another element or layer, it includes not only being located directly on the other element or layer, but also with intervening other layers or elements. On the other hand, when an element is referred as being "directly on" or "immediately on," it indicates that no intervening element or layer is interposed.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (including technical and scientific terms) used herein may be used with the meaning commonly understood by those of ordinary skill in the art to which the present invention belongs. In addition, terms defined in a commonly used dictionary are not to be interpreted ideally or excessively unless clearly defined in particular.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

Figure 2:
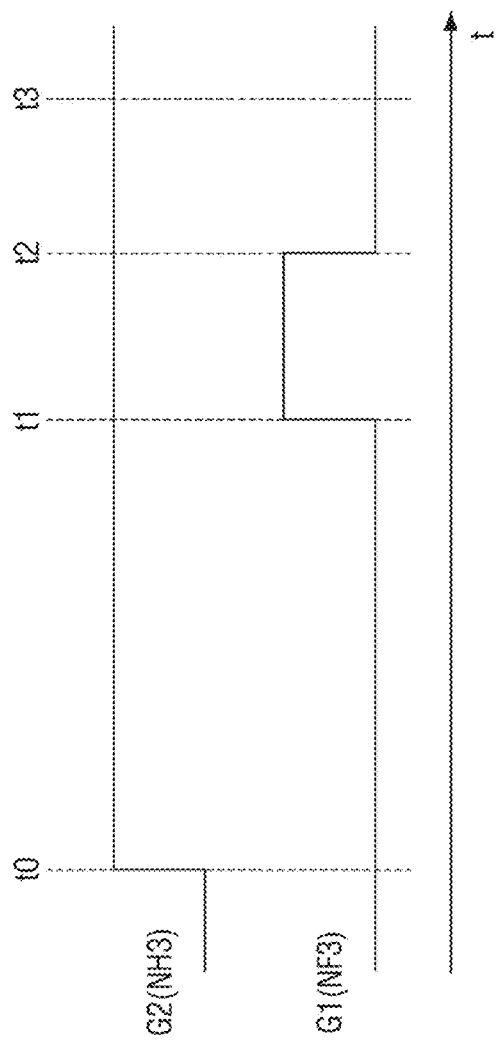
FIG. 2 is a view for describing gas supply in the substrate processing apparatus of FIG. 1.
Figure 3:
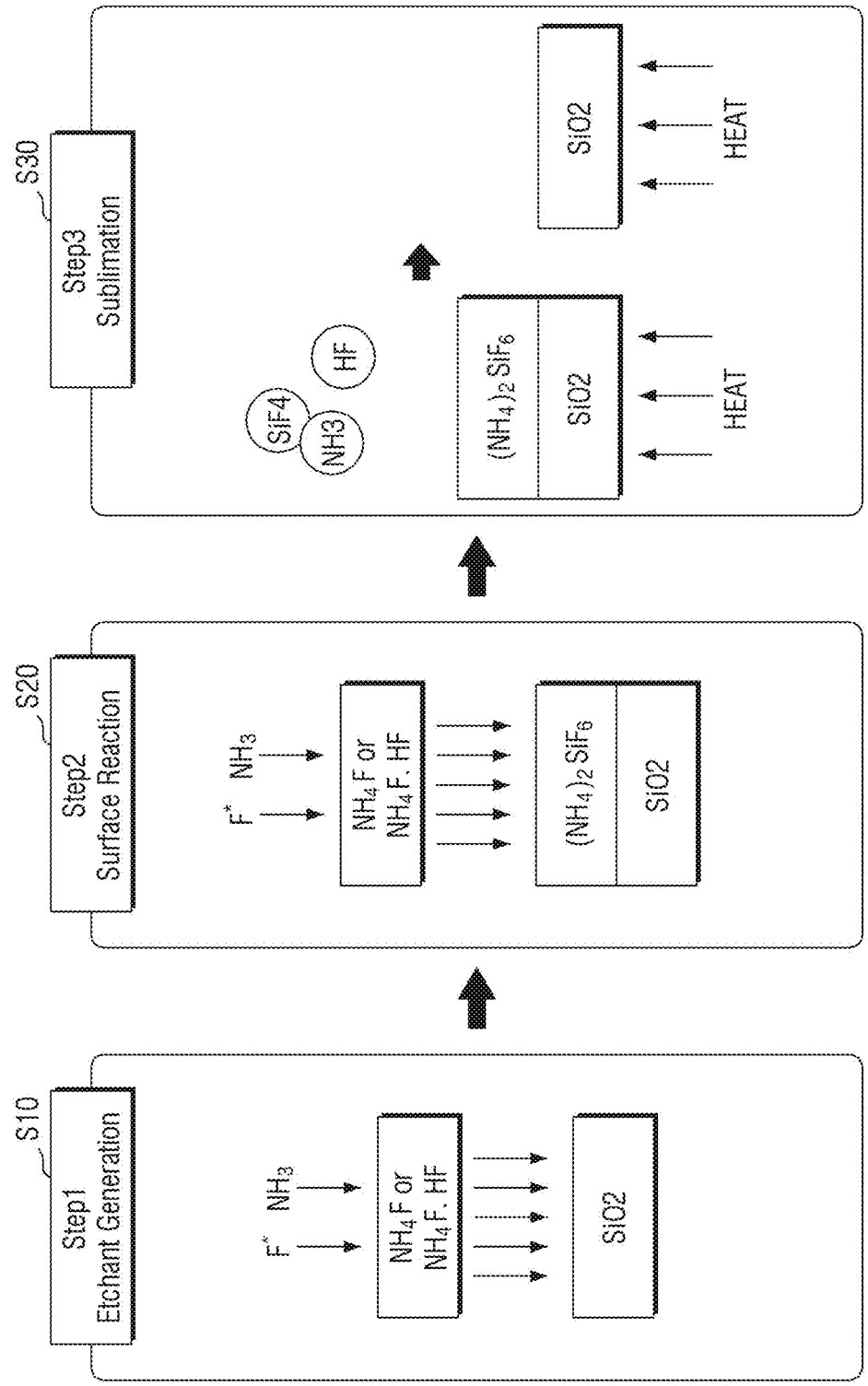
FIG. 3 is a conceptual diagram illustrating a dry cleaning process of the substrate processing apparatus of FIG. 1.

FIG. 1 is a conceptual diagram for describing a substrate processing apparatus according to a first embodiment of the present invention. FIG. 2 is a view for describing gas supply in the substrate processing apparatus of FIG. 1. FIG. 3 is a conceptual diagram for describing a dry cleaning process of the substrate processing apparatus of FIG. 1.

Referring first to FIG. 1, a substrate processing apparatus 1 according to a first embodiment of the present invention includes a process chamber 100, a support module 200, an electrode module 300, a gas supply module 500, a control module. 600, a first coating layer 710, and the like.

The process chamber 100 provides a processing space 101, in which the substrate W is processed. The process chamber 100 may have a circular cylindrical shape. An opening (not shown) is formed in one wall of the process chamber 100. The opening is used as an entrance through which the substrate W can be carried in and out. The entrance can be opened and closed by a door. An exhaust port (not shown) is installed on the bottom surface of the process chamber 100. The exhaust port functions as an outlet through which by-products generated in the processing space 101 are discharged to the outside of the process chamber 100. The exhaust operation is performed by the pump.

The support module 200 is installed in the processing space 101 and supports the substrate W. The support module 200 may be an electrostatic chuck that supports the substrate W using an electrostatic force, but is not limited thereto. The electrostatic chuck may include a dielectric plate, on which the substrate W is placed, an electrode installed in the dielectric plate and providing electrostatic force so that the substrate W is adsorbed to the dielectric plate, and a heater installed in the dielectric plate for heating the substrate W to control the temperature of the substrate W.

The electrode module 300 includes an electrode (or upper electrode) 330, an ion blocker 340, a shower head 350, and the like, and serves as a capacitively coupled plasma source. The gas supply module 500 includes a first gas supply module 510 and a second gas supply module 520. The control module 600 controls operations of the support module 200, the electrode module 300, and the gas supply modules 510 and 520.

A first space 301 is disposed between the electrode 330 and the ion blocker 340, and a second space 302 is disposed between the ion blocker 340 and the shower head 350. The processing space 101 is located under the shower head 350.

The electrode 330 may be connected to a high frequency power supply 311, and the ion blocker 340 may be connected to a constant voltage (e.g., a ground voltage). The electrode 330 includes a plurality of first supply holes 331. The first gas supply module 510 provides the first gas G1 to the first space 301 through the electrode 330 (i.e., the first supply hole 331).

The electromagnetic field generated between the electrode 330 and the ion blocker 340 excites the first gas G1 to a plasma state. The first gas excited into a plasma state (i.e., plasma effluent) includes radicals, ions and/or electrons.

The ion blocker 340 is formed of a conductive material, and may have, for example, a plate shape such as a disk. The ion blocker 340 may be connected to a constant voltage, but is not limited thereto. The ion blocker 340 includes a plurality of first through holes 342 formed in the vertical direction. Radicals or uncharged neutral species in the plasma effluent are provided to the second space 302 passing through the first through-hole 342 of the ion blocker 340 (see reference numeral D1). On the other hand, it is difficult for charged species (i.e., ions) to pass through the first through hole 342 of the ion blocker 340.

The shower head 350 may be formed of a conductive material and may have, for example, a plate shape such as a disk. The shower head 350 may be connected to a constant voltage, but is not limited thereto.

A second supply hole 341 for supplying the second gas G2 toward the second space 302 is provided in the ion blocker 340. In addition, a third supply hole 351 for supplying the second gas G2 toward the second space 302 is provided in the shower head 350. The second gas supply module 520 provides the second gas G2 to the second space 302 (see reference numerals E1 and E2) through the ion blocker 340 (i.e., the second supply hole 341) and/or the shower head 350 (i.e., the third supply hole 351). Unlike the illustration, in order to supply the second gas G2, the second supply hole 341 may be installed only in the ion blocker 340 and the third supply hole 351 may not be installed in the shower head 350. Conversely, the second supply hole 341 may not be installed in the ion blocker 340 and the third supply hole 351 may be installed only in the shower head 350.

In the second space 302, the plasma effluent (e.g., radicals) and the second gas G2 mix and react to generate an etchant.

The shower head 350 includes a plurality of second through holes 352 formed in the vertical direction. Through the second through hole 352, the etchant generated in the second space 302, the unreacted plasma effluent and the second gas G2 are provided to the processing space 101 (see reference numeral D2).

Specifically, for example, a patterned structure is formed on the substrate, and in particular, it may include an exposed silicon layer and oxide layer. The oxide layer may be, for example, silicon oxide ($SiO_2$).

For dry cleaning the oxide layer (i.e., silicon oxide), the following process is used.

The first gas supply module 510 supplies a fluorine-containing gas as the first gas G1. For example, the fluorine-containing gas may be nitrogen trifluoride ($NF_3$), but is not limited thereto. Optionally, the first gas supply module 510 may additionally supply at least one of He, Ar, $N_2$, and $H_2$ to the first supply hole 331. Ar and He may be used for plasma generation together with $NF_3$, He may be used for dilution, and $N_2$ and $H_2$ may be used for carriers.

The second gas supply module 520 supplies nitrogen and hydrogen-containing gases as the second gas G2. For example, the nitrogen and hydrogen-containing gas may be ammonia ($NH_3$), but is not limited thereto. Optionally, the second gas supply module 520 may additionally supply at least one of He, Ar, $N_2$, and $H_2$ to the second supply hole 341 and/or the third supply hole 351.

Here, referring to FIGS. 1 and 2, at time t0, a second gas G2 (ammonia gas) is provided to the second space 302 before plasma is formed. The second gas G2 is delivered to the processing space 101 through the shower head 350 to form a process atmosphere.

Between time t1 and time t2, a first gas G1 (nitrogen trifluoride gas) is provided to the first space 301. Then, the high frequency power supply 311 is supplied to the electrode 330 to excite the first gas G1 in the form of plasma in the first space 301. Plasma effluents such as radicals, ions and/or electrons are formed. The ions are filtered by the ion blocker 340, and the remaining plasma effluent (especially fluorine radicals) may pass through the ion blocker 340. In the second space 302, the plasma effluent passing through the ion blocker 340 and the second gas G2 (i.e., ammonia gas) react and mix to form an etchant.

Here, referring to FIG. 3, fluorine-containing radicals ($F^*$, $NF_3^*$, etc.), which are plasma effluents, react with ammonia gas ($NH_3$) to form an etchant ($NH_4F^*$ or $NH_4F^* \cdot HF^*$) that can easily react with silicon oxide ($SiO_2$) (see Chemical Formula 1) (S10).

$$NH_3 + NF_3^* \rightarrow NH_4F^* \text{ or } NH_4F^* \cdot HF^* \quad \text{(Chemical Formula 1)}$$

The etchant formed in this way, the unreacted plasma effluent, ammonia gas ($NH_3$), and the like are delivered to the processing space 101.

Then, the etchant ($NH_4F^*$ or $NH_4F^* \cdot HF^*$) reacts with the surface of the silicon oxide (S20). As a result of the reaction, products such as $(NH_4)_2SiF_6$, and $H_2O$ may be formed (see Chemical Formula 2). Here, $H_2O$ is vapor, and $(NH_4)_2SiF_6$ remains thin on the surface of silicon oxide as a solid. The silicon (Si) in $(NH_4)_2SiF_6$ comes from the exposed silicon oxide, while nitrogen, hydrogen, fluorine, etc. forming the remainder come from plasma effluent, ammonia gas, etc. During this reaction process, the temperature of the processing space 101 may be maintained at 20° C. to 100° C.

$$NH_4F^* \text{ or } NH_4F^* \cdot HF^* + SiO_2 \rightarrow (NH_4)_2 SiF_6(s) + H_2O \quad \text{(Chemical Formula 2)}$$

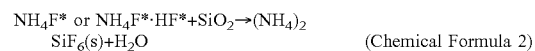

Referring back to FIG. 2, at time t3, the pump is operated to remove by-products. Specifically, as shown in S30 of FIG. 3, $H_2O$ or the like is vapor, and thus may be removed by a pump. The temperature of the processing space 101 is increased to 100° C. or higher to sublimate $(NH_4)_2SiF_6$. Sublimated $(NH_4)_2SiF_6$ can also be removed by pump operation.

Meanwhile, in the process of generating an etchant by reacting fluorine-containing radicals (e.g., $F^*$) with ammonia gas ($NH_3$), fluorine free radicals are generated (see Chemical Formula 3). However, these fluorine free radicals etch the silicon layer on the substrate W in the processing space 101.

$$NH_3 + F^* \rightarrow NH_4F^* + F^*(\text{free}) \quad \text{(Chemical Formula 3)}$$

In summary, the etchant etches the oxide layer (silicon oxide), and the fluorine free radical etches the silicon layer.

However, depending on the purpose of dry cleaning, there are cases where the etching selectivity ratio between the silicon layer and the oxide layer should not be high, and on the contrary, there are cases where the etching selectivity ratio between the silicon layer and the oxide layer should be high.

Referring back to FIG. 1, in the substrate processing apparatus 1 according to the first embodiment of the present invention, the first coating layer 710 containing nickel is formed in the second space 302 to adjust the amount of fluorine free radicals. Accordingly, the etching amount of the silicon layer can be adjusted, and as a result, the selectivity ratio between the silicon layer and the oxide layer can be adjusted.

Specifically, the first coating layer 710 is installed in the second space 302, but is not installed in the processing space 101. For example, the first coating layer 710 is formed on the first surface (i.e., the upper surface) of the shower head 350 facing the second space 302, and is not formed on the second surface (i.e., the lower surface) of the shower head 350 facing the processing space 101. The first coating layer 710 may include nickel. Since nickel reacts with fluorine free radicals in the second space 302 to generate nickel fluoride (NiF$_2$) (see Chemical Formula 4), nickel serves to reduce the amount of fluorine free radicals.

$$Ni+F^* \rightarrow NiF_2 \quad \text{(Chemical Formula 4)}$$

That is, as the amount of nickel in the second space 302 increases, the amount of fluorine free radicals decreases, and as the amount of nickel decreases, the amount of fluorine free radicals increases.

The first coating layer 710 may be a nickel alloy. For example, the first coating layer 710 may include a nickel-aluminum alloy or a nickel-phosphorus alloy. In a nickel alloy, when the ratio of aluminum or phosphorus to nickel is low (i.e., the nickel content is high), the amount of fluorine free radicals decreases and the silicon layer is etched less. On the other hand, when the ratio of aluminum or phosphorus to nickel is high (i.e., when the nickel content is low), the amount of fluorine free radicals increases and the silicon layer is etched much. In summary, in the nickel alloy, if the ratio of aluminum or phosphorus to nickel is the first ratio, the silicon layer in the substrate W is etched by the first etching amount. On the other hand, in the nickel alloy, when the ratio of aluminum or phosphorus to nickel is a second ratio greater than the first ratio, the silicon layer in the substrate W is etched by the second etching amount greater than the first etching amount.

Meanwhile, a coating layer containing nickel is not formed in the processing space 101. Nickel also reacts well with hydrogen series, so it can easily attract etchants (NH$_4$F* or NH$_4$F*·HF*). As a result, if a coating layer including nickel is formed in the processing space 101, the oxide layer may not be etched by a desired target amount. That is, in order to stably etch the oxide layer, a coating layer containing nickel is not formed in the processing space 101. For example, the lower surface (second surface) of the shower head 350, the inner wall and/or the bottom surface of the process chamber 100 may be made of a material having low reactivity with an etchant, such as aluminum. Similarly, a coating layer containing nickel is not formed on the surface of the support module 200 supporting the substrate W, but may be made of aluminum.

In the substrate processing apparatus according to the first embodiment of the present invention, by forming the first coating layer 710 containing nickel in the second space 302, it is possible to adjust the etching amount of the silicon layer in the processing space 101. That is, the etching selectivity ratio between the oxide layer and the silicon layer may be adjusted by using the first coating layer 710 including nickel.

Figure 4:
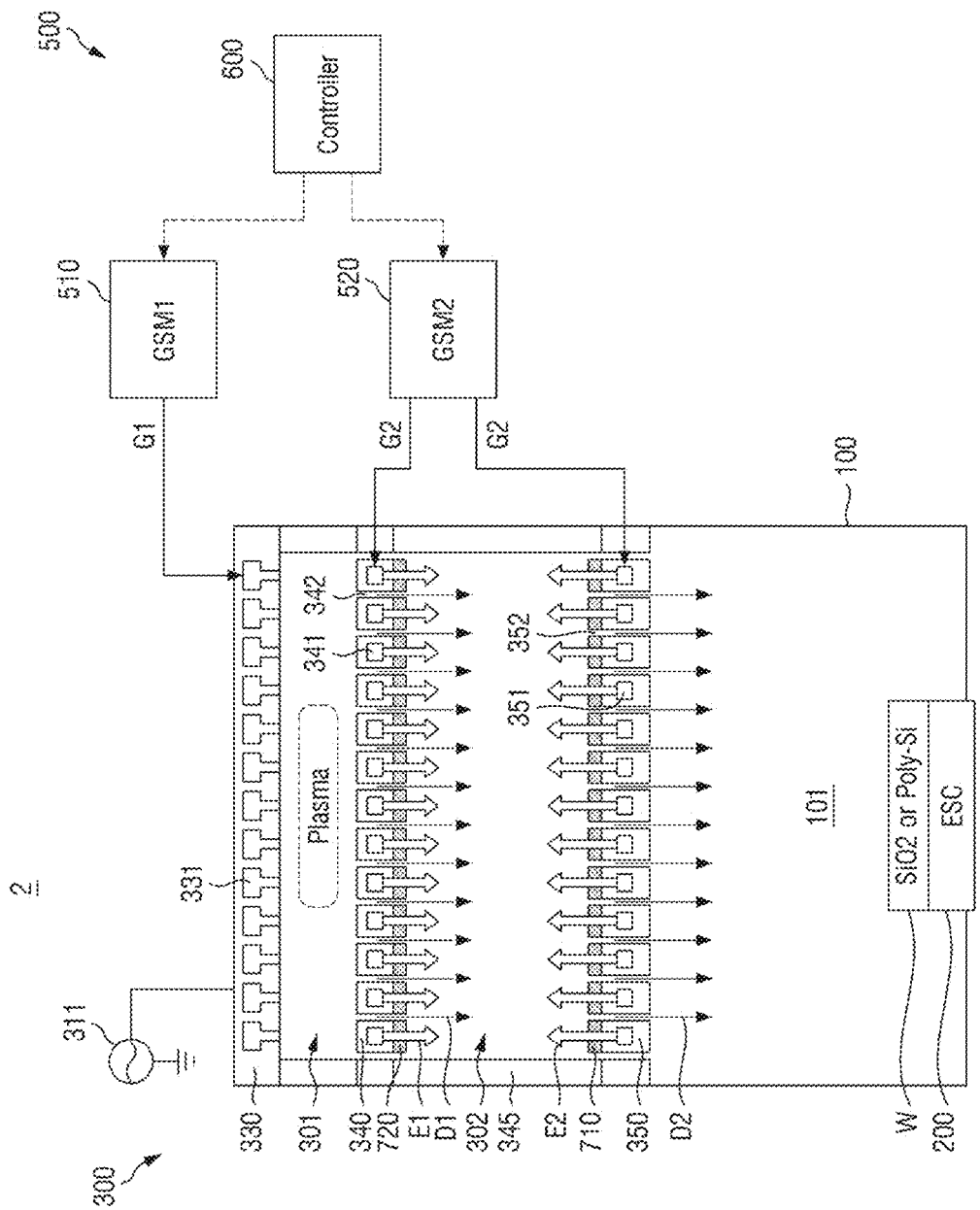
FIG. 4 is a conceptual diagram for describing a substrate processing apparatus according to a second embodiment of the present invention.
Figure 5:
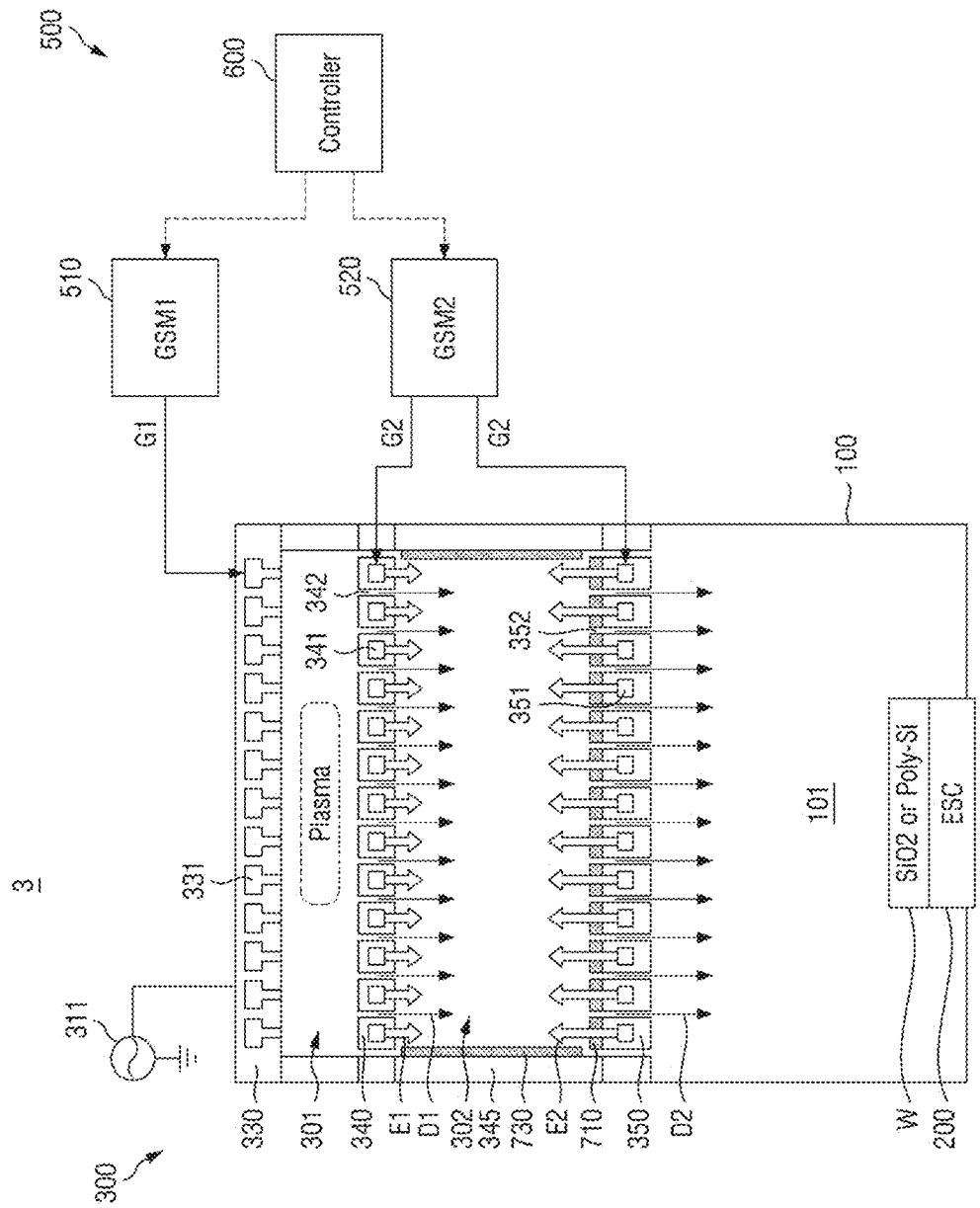
FIG. 5 is a conceptual diagram for describing a substrate processing apparatus according to a third embodiment of the present invention.

FIG. 4 is a conceptual diagram for describing a substrate processing apparatus according to a second embodiment of the present invention. FIG. 5 is a conceptual diagram for describing a substrate processing apparatus according to a third embodiment of the present invention. For convenience of description, the points different from those described with reference to FIGS. 1 to 3 will be mainly described.

First, referring to FIG. 4, in the substrate processing apparatus 2 according to the second embodiment of the present invention, the coating layer 720 may be further formed on the third surface (i.e., the lower surface) of the ion blocker 340 facing the second space 302. The second coating layer 720 includes nickel and may be a nickel alloy.

The second coating layer 720 may include a nickel-aluminum alloy or a nickel-phosphorus alloy.

Referring to FIG. 5, in the substrate processing apparatus 3 according to the third embodiment of the present invention, a sidewall 345 is located between the ion blocker 340 and the shower head 350. A third coating layer 730 may be further formed on the sidewall 345 facing the second space 302. The third coating layer 730 may include nickel and may be a nickel alloy. The third coating layer 730 may include a nickel-aluminum alloy or a nickel-phosphorus alloy.

As described above, in a nickel alloy, when the ratio of aluminum or phosphorus to nickel is low (i.e., the nickel content is high), the amount of fluorine free radicals decreases and the silicon layer is etched less. On the other hand, when the ratio of aluminum or phosphorus to nickel is high (i.e., the nickel content is low), the amount of fluorine free radicals increases and the silicon layer is etched much. That is, in the nickel alloy, when the ratio of aluminum or phosphorus to nickel is the first ratio, the silicon layer in the substrate W is etched by the first etching amount. On the other hand, in the nickel alloy, when the ratio of aluminum or phosphorus to nickel is a second ratio greater than the first ratio, the silicon layer in the substrate W is etched by the second etching amount greater than the first etching amount.

Unlike the illustration, plating layers 710, 720, 730 containing nickel may be formed on all of the upper surface of the shower head 350, the lower surface of the ion blocker 340 and the sidewall 345 constituting the second space 302.

The etching amount of the silicon layer may be determined depending on how much plating layers 710, 720, 730 are formed among the upper surface of the shower head 350, the lower surface of the ion blocker 340, and the sidewall 345 constituting the second space 302. For example, if the plating layers are formed on all surfaces constituting the second space 302 (that is, 100%), the etching amount of the silicon layer can be minimized. On the other hand, if the plating layer is formed on only 50% of the surfaces constituting the second space 302, the etching amount of the silicon layer can be reduced by half. On the other hand, if the plating layer is formed on only 30% of the surfaces constituting the second space 302, the etching amount of the silicon layer can be reduced to 70%.

Figure 6:
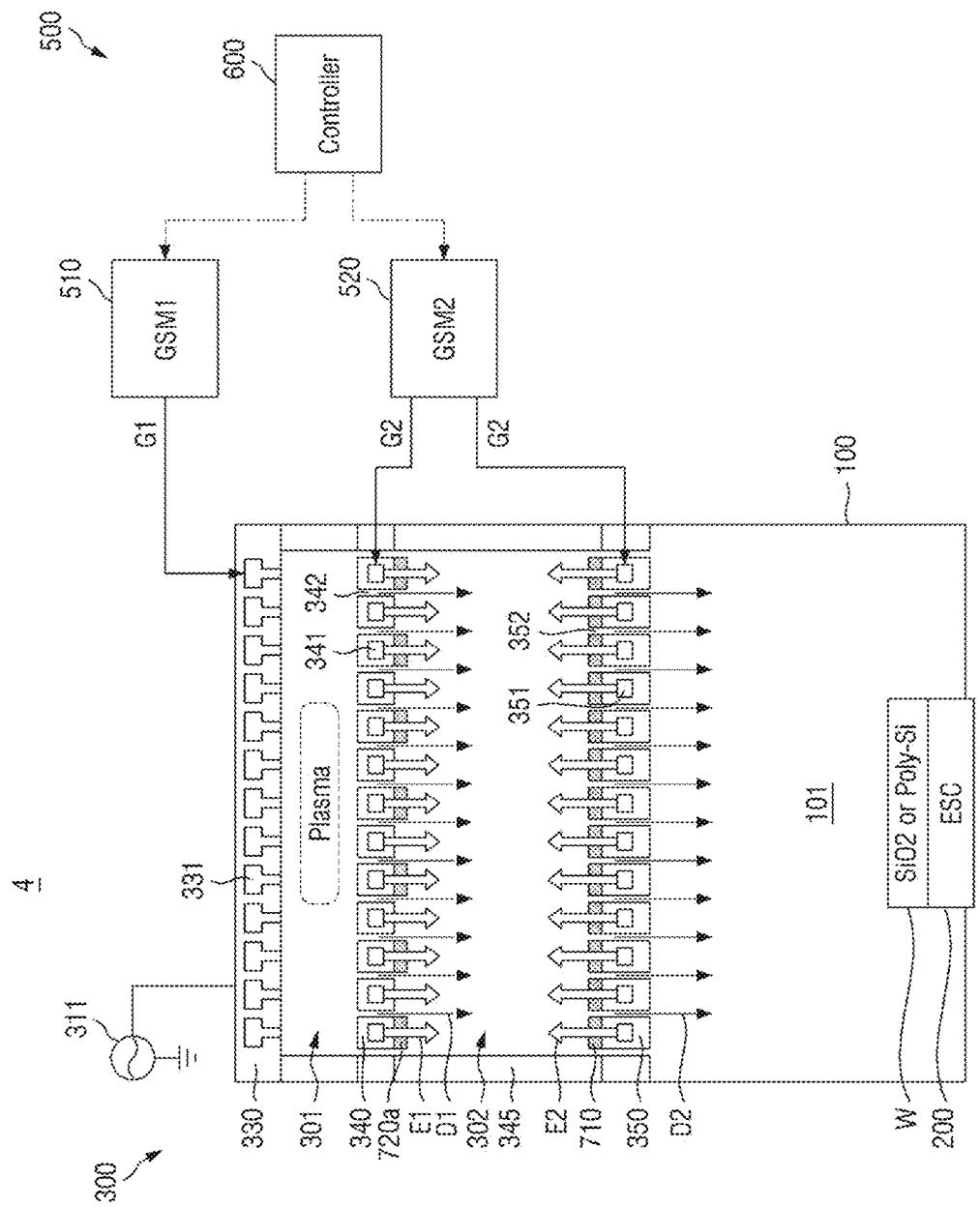
FIG. 6 is a conceptual diagram illustrating a substrate processing apparatus according to a fourth embodiment of the present invention.
Figure 7:
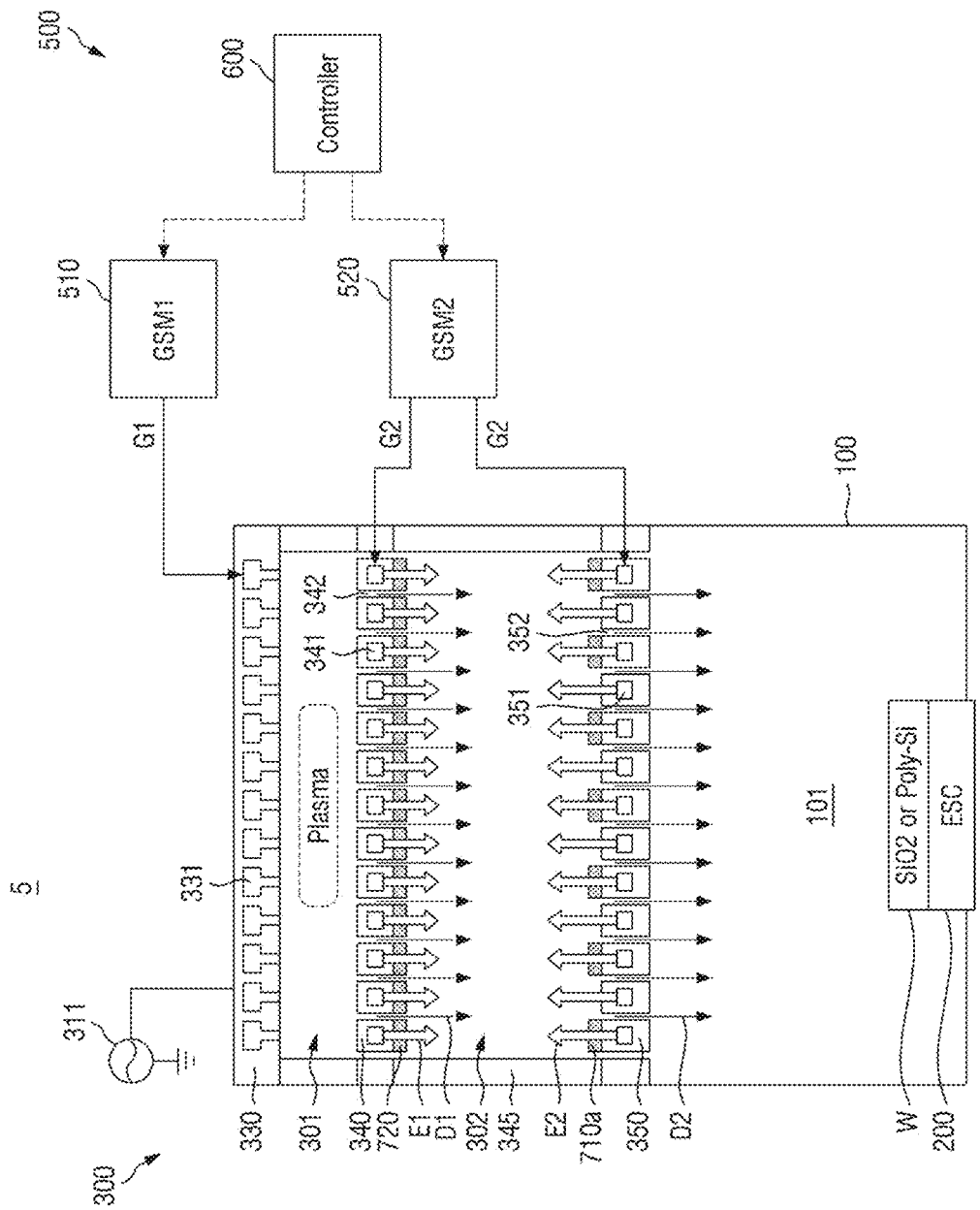
FIG. 7 is a conceptual diagram for describing a substrate processing apparatus according to a fifth embodiment of the present invention.
Figure 8:
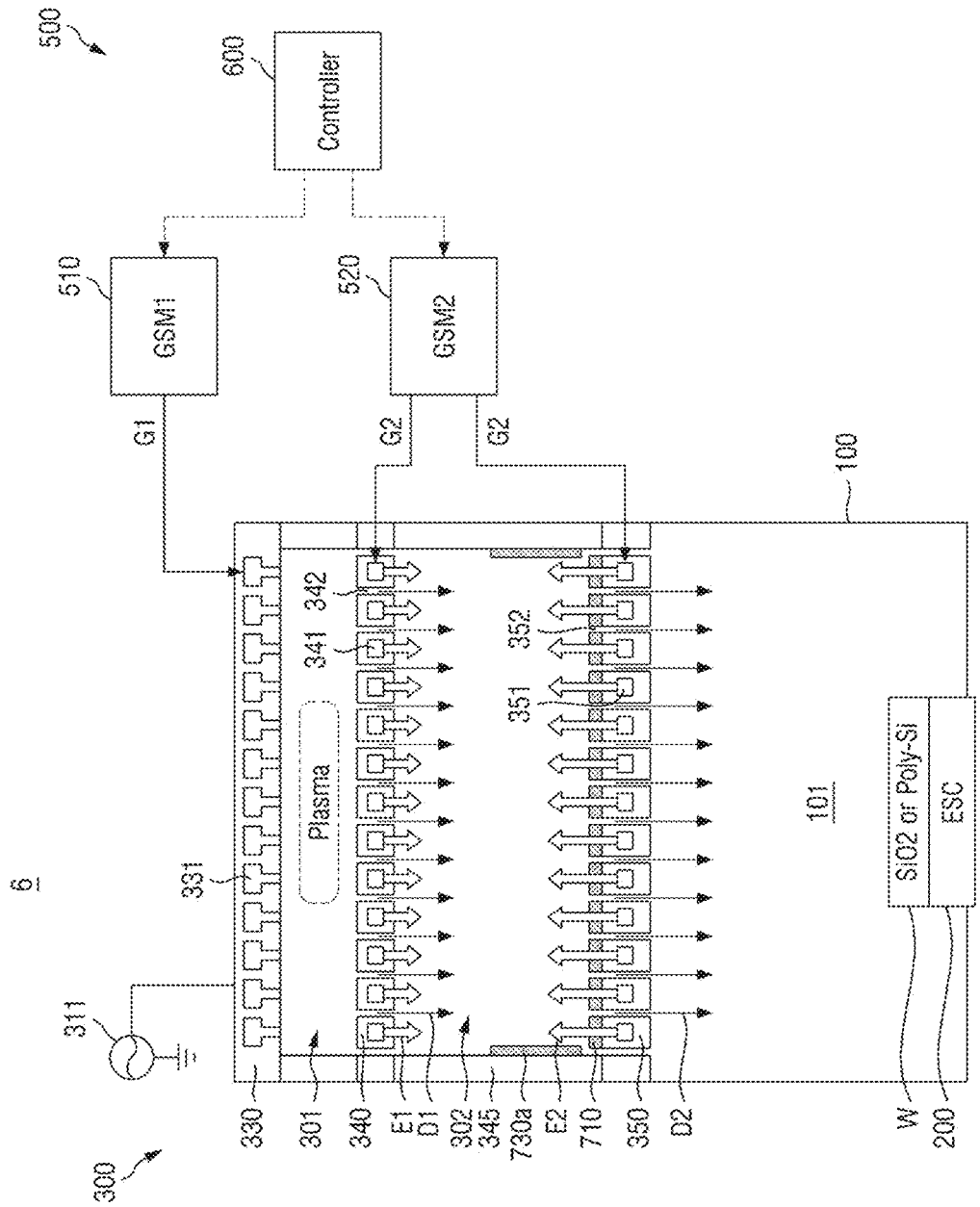
FIG. 8 is a conceptual diagram for describing a substrate processing apparatus according to a sixth embodiment of the present invention.

FIG. 6 is a conceptual diagram illustrating a substrate processing apparatus according to a fourth embodiment of the present invention. FIG. 7 is a conceptual diagram for describing a substrate processing apparatus according to a fifth embodiment of the present invention. FIG. 8 is a conceptual diagram illustrating a substrate processing apparatus according to a sixth embodiment of the present invention. For convenience of description, the points different from those described with reference to FIGS. 1 to 5 will be mainly described.

Referring to FIG. 6, in the substrate processing apparatus 4 according to the fourth embodiment of the present invention, the second coating layer 720a is patterned, and the second coating layer 720a is formed on a portion of the third surface (i.e., the lower surface) of the ion blocker 340, and the second coating layer is not formed on the other portion of the third surface. As shown, the first coating layer 710 may be formed on the first surface of the shower head 350.

Referring to FIG. 7, in the substrate processing apparatus 5 according to the fifth embodiment of the present invention, the first coating layer 710a is patterned, and the first coating layer 710a is formed on a portion of the first surface (i.e., the upper surface) of the shower head 350, and the first coating layer is not formed on the other portion of the first surface.

As shown, a second coating layer 720 may be formed on the third surface of the ion blocker 340.

Referring to FIG. 8, in the substrate processing apparatus 6 according to the sixth embodiment of the present invention, the third coating layer 730a is patterned, and the third coating layer 730a is formed on a portion of the sidewall 345 between the ion blocker 340 and the shower head 350, and the third coating layer is not formed on the other portion of the sidewall 345.

As described above, depending on how much plating layers 710, 720, 730 are formed among the upper surface of the shower head 350, the lower surface of the ion blocker 340, and the sidewall 345 constituting the second space 302, the etching amount of the silicon layer may be determined.

Figure 9:
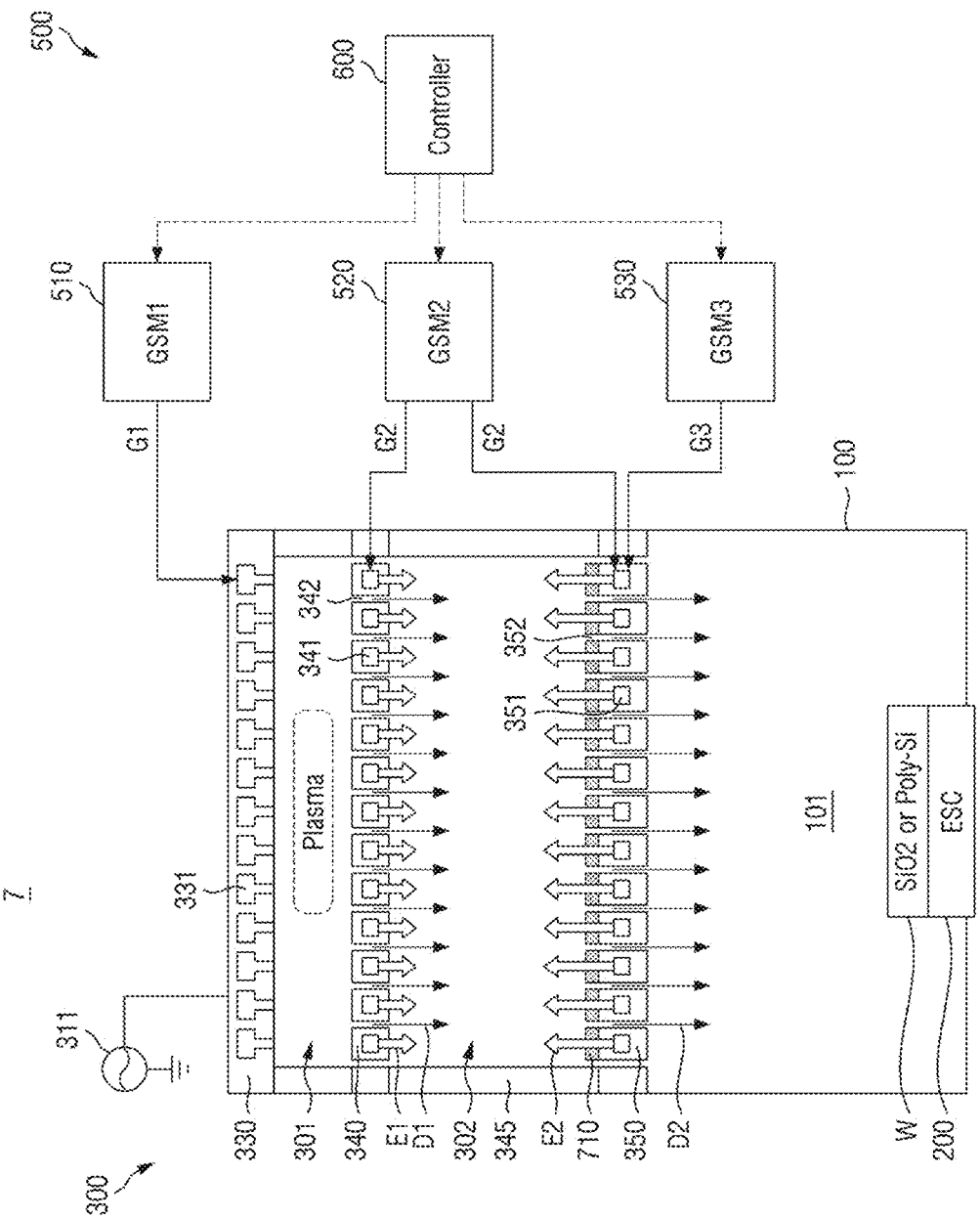
FIG. 9 is a conceptual diagram for describing a substrate processing apparatus according to a seventh embodiment of the present invention.

FIG. 9 is a conceptual diagram for describing a substrate processing apparatus according to a seventh embodiment of the present invention. For convenience of description, the points different from those described with reference to FIGS. 1 to 3 will be mainly described.

Referring to FIG. 9, the gas supply module 500 of the substrate processing apparatus 7 according to the seventh exemplary embodiment may further include a third gas supply module 530.

The third gas supply module 530 may additionally supply the third gas G3 through the third supply hole 351 of the shower head 350. Alternatively, although not shown separately in the drawings, a separate supply hole facing the processing space 101 is installed in the shower head 350, and the third gas G3 may be provided through a separate supply hole of the third gas supply module 530. The third gas G3 may be, for example, nitrogen ($N_2$).

Nitrogen ($N_2$) gas may decrease the etching rate of silicon oxide and increase uniformity. This is because the etchant ($NH_4F^* \cdot HF^*$) reacts with $N_2$, so that $HF^*$ decreases while the amount of $NH_4F^*$ increases.

Figure 10:
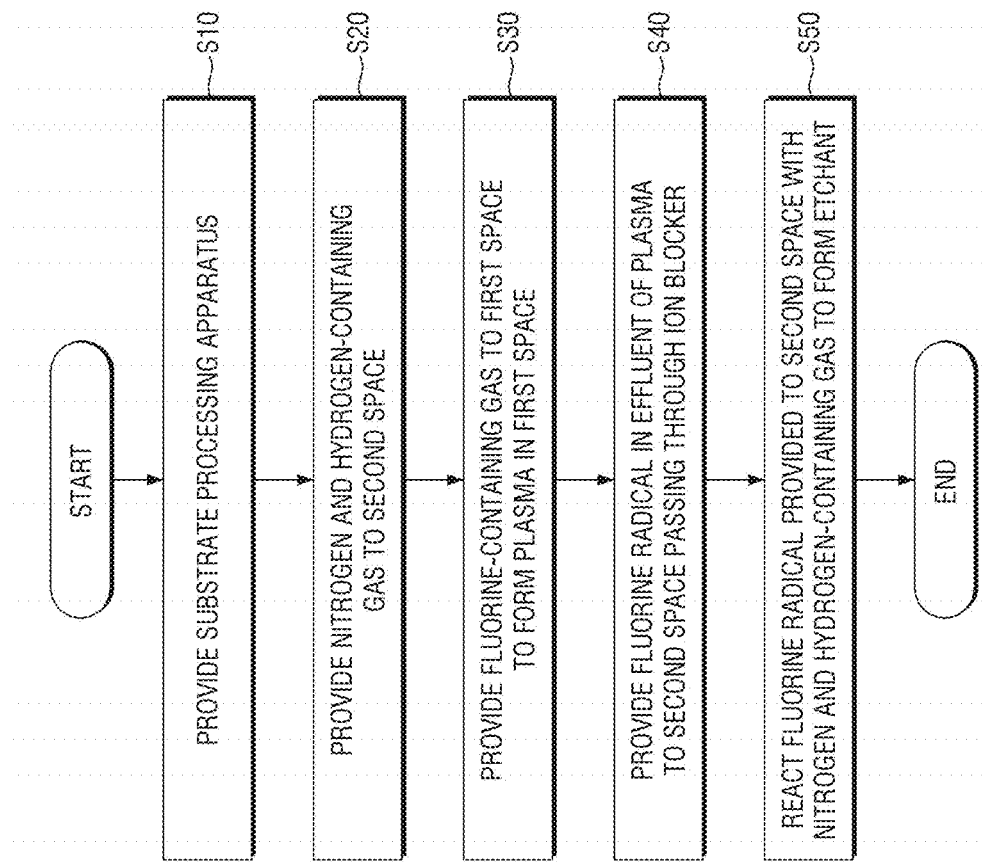
FIG. 10 is a flowchart for describing a substrate processing method according to some embodiments of the present invention.

FIG. 10 is a flowchart illustrating a substrate processing method according to some embodiments of the present invention.

Referring to FIGS. 1 and 10, a substrate processing apparatus 1 is provided (S110).

Specifically, the substrate processing apparatus 1 comprises the first space 301 disposed between the electrode 330 and the ion blocker 340, the second space 301 disposed between the ion blocker 340 and the shower head 350, and a processing space 101 under the shower head 350 for processing the substrate W. In particular, the first coating layer 710 is formed on the first surface (i.e., the upper surface) of the shower head 350 facing the second space 302, and is not formed on the second surface (i.e., the lower surface) of the shower head 350 facing the processing space 101. The first coating layer 710 contains nickel.

Then, a nitrogen and hydrogen-containing gas is provided to the second space 302 (S120). Specifically, the nitrogen and hydrogen-containing gas may be ammonia gas, but is not limited thereto.

Then, a fluorine-containing gas is provided to the first space 301 to form plasma in the first space 301 (S130).

Specifically, the fluorine-containing gas may be nitrogen trifluoride ($NF_3$), but is not limited thereto. The high frequency power supply 311 is supplied to the electrode 330 to excite the first gas G1 in the form of plasma in the first space 301. Plasma effluents such as radicals, ions and/or electrons are formed.

Subsequently, fluorine radicals in the plasma effluent pass through the ion blocker 340 and are provided to the second space 302 (S140). The ions are filtered by the ion blocker 340, and the remaining plasma effluent (specifically, fluorine-containing radicals) may pass through the ion blocker 340.

Then, an etchant is formed by reacting the fluorine radicals and the nitrogen and hydrogen-containing gas that are provided to the second space 302 (S150). In particular, at least a portion of the fluorine free radicals generated when the etchant is formed is removed by the first coating layer 710. Specifically, fluorine-containing radicals (such as $F^*$), which are plasma effluents, react with ammonia gas ($NH_3$) to form an etchant (e.g., $NH_4F^*$) that can easily react with silicon oxide ($SiO_2$). On the other hand, in the process of generating an etchant by reacting fluorine-containing radicals (e.g., $F^*$) with ammonia gas ($NH_3$), fluorine free radicals are generated. The first coating layer 710 including nickel formed in the second space 302 removes at least a portion of fluorine free radicals. That is, the first coating layer 710 may adjust the amount of fluorine free radicals. Accordingly, the etching amount of the silicon layer can be adjusted, and as a result, the selectivity ratio between the silicon layer and the oxide layer can be adjusted.

Although embodiments of the present invention have been described with reference to the above and the accompanying drawings, those of ordinary skill in the art to which the present invention pertains can understand that the present invention can be practiced in other specific forms without changing its technical spirit or essential features. Therefore, it should be understood that the embodiments described above are illustrative in all respects and not restrictive.

What is claimed is:

1. An apparatus for processing a substrate comprising: a first space disposed between an electrode and an ion blocker; a second space disposed between the ion blocker and a shower head; a processing space under the shower head for processing a substrate; a first supply hole for providing a first gas for generating plasma to the first space; a second supply hole for providing a second gas to be mixed with an effluent of the plasma to the second space; and a first coating layer formed on a first surface of the shower head facing the second space, not formed on a second surface of the shower head facing the processing space, and containing nickel; and a second coating layer containing nickel, wherein the ion blocker has a third surface facing the second space, the third surface has one portion on which the second coating layer is formed and another portion on which the second coating layer is not formed.

2. The apparatus of claim 1, wherein the second space further comprises a sidewall disposed between the ion blocker and the shower head, and further comprises a third coating layer formed on the sidewall facing the second space and containing nickel.

3. An apparatus for processing a substrate comprising: a first space disposed between an electrode and an ion blocker; a second space disposed between the ion blocker and a shower head; a processing space under the shower head for processing a substrate; a first supply hole for providing a first gas for generating plasma to the first space; a second supply hole for providing a second gas to be mixed with an effluent of the plasma to the second space; and a first coating layer formed on a first surface of the shower head facing the second space, not formed on a second surface of the shower head facing the processing space, and containing nickel, wherein the second space further comprises a sidewall disposed between the ion blocker and the shower head and a second coating layer containing nickel, wherein the sidewall disposed between the ion blocker and the shower head has one portion on which the third second coating layer is formed an another portion on which the third second coating layer is not formed.

4. The apparatus of claim 1, wherein the first surface of the shower head facing the second space has one portion on which the first coating layer is formed and another portion on which the first coating layer is not formed.

5. The apparatus of claim 1, wherein a coating layer containing nickel is not formed on a surface of a support module installed in the processing space and for supporting a substrate.

6. The apparatus of claim 1, wherein a coating layer including nickel is not formed on an inner wall and a bottom surface of a process chamber surrounding the processing space.

7. The apparatus of claim 1, wherein the first gas is a fluorine-containing gas, the second gas is a nitrogen and hydrogen-containing gas, and the substrate includes an exposed silicon layer and oxide layer.

8. The apparatus of claim 1, wherein the first coating layer is a nickel-aluminum alloy layer or a nickel-phosphorus alloy layer.

9. The apparatus of claim 8, wherein the first gas comprises nitrogen trifluoride, the second gas comprises ammonia, and the substrate comprises an exposed silicon layer and oxide layer,
wherein the silicon layer is etched by a first etching amount in response to the first coating layer having a first ratio of aluminum or phosphorus to nickel,
wherein the silicon layer is etched by a second etching amount greater than the first etching amount in response to the first coating layer having a second ratio of aluminum or phosphorus to nickel greater than the first ratio.

10. The apparatus of claim 1, wherein the second supply hole is installed in the ion blocker facing the second space or in the shower head facing the second space.

11. An apparatus for processing a substrate comprising: a first space disposed between an electrode and an ion blocker; a second space disposed between the ion blocker and a shower head; a processing space under the shower head for processing a substrate, on which a silicon layer and an oxide layer are exposed; a support module installed in the processing space and for supporting the substrate; a first supply hole for providing nitrogen trifluoride for generating plasma to the first space; a second supply hole for providing ammonia gas to be mixed with an effluent of the plasma to the second space; a first coating layer formed on an upper surface of the shower head and not formed on a lower surface of the shower head and a surface of the support module; and a second coating layer containing nickel, wherein the ion blocker has a lower surface facing the second space, the lower surface has one portion on which the second coating layer is formed and another portion on which the second coating layer is not formed, wherein the first coating layer includes a nickel-aluminum alloy layer or a nickel-phosphorus alloy layer, and an etching amount of the silicon layer varies according to a ratio of aluminum or phosphorus to nickel.

12. The apparatus of claim 11, wherein the silicon layer is etched by a first etching amount in response to the ratio of aluminum or phosphorus to nickel of the coating layer being a first ratio,
wherein the silicon layer is etched by a second etching amount greater than the first etching amount in response to the ratio of aluminum or phosphorus to nickel of the coating layer being a second ratio greater than the first ratio.

13. The apparatus of claim 11, wherein the second space further comprises a sidewall disposed between the ion blocker and the shower head, and further comprise an additional coating layer formed on the sidewall facing the second space and containing nickel.

* * * * *